United States Patent
Gilet et al.

(10) Patent No.: US 8,971,371 B2
(45) Date of Patent: Mar. 3, 2015

(54) LASER DEVICE WITH COUPLED LASER SOURCE AND WAVEGUIDE

(75) Inventors: Philippe Gilet, Teche (FR); Alexei Tchelnokov, Meylan (FR); Laurent Fulbert, Voiron (FR)

(73) Assignee: Commissariat a l'Energie Atomique, Paris (FR)

( * ) Notice: Subject to any disclaimer, the term of this patent is extended or adjusted under 35 U.S.C. 154(b) by 1016 days.

(21) Appl. No.: 12/516,184

(22) PCT Filed: Dec. 3, 2007

(86) PCT No.: PCT/EP2007/063123
§ 371 (c)(1),
(2), (4) Date: Jan. 25, 2010

(87) PCT Pub. No.: WO2008/068209
PCT Pub. Date: Jun. 12, 2008

(65) Prior Publication Data
US 2010/0142580 A1 Jun. 10, 2010

(30) Foreign Application Priority Data

Dec. 5, 2006 (FR) .................................. 06 55313

(51) Int. Cl.
*H01S 5/00* (2006.01)
*H01S 5/026* (2006.01)
*H01S 5/14* (2006.01)
*H01S 5/02* (2006.01)
(Continued)

(52) U.S. Cl.
CPC . *H01S 5/026* (2013.01); *H01S 5/14* (2013.01); *H01S 5/021* (2013.01); *H01S 5/12* (2013.01); *H01S 5/125* (2013.01)

USPC ............................................................ 372/50.11

(58) Field of Classification Search
CPC ........... H01S 5/125; H01S 5/021; H01S 5/14; H01S 5/26
USPC ......................... 372/50.11, 45.01, 75; 438/31
See application file for complete search history.

(56) References Cited

U.S. PATENT DOCUMENTS 5,278,926 A    1/1994   Doussiere
5,673,284 A *  9/1997   Congdon et al. ............. 372/50.1
(Continued)

FOREIGN PATENT DOCUMENTS

FR    2826789  A1    3/2003
GB    2325334  A    11/1998

OTHER PUBLICATIONS

French Search Report for FR 0655313 dated Nov. 6, 2007.
(Continued)

*Primary Examiner* — Tuan Nguyen
(74) *Attorney, Agent, or Firm* — Nixon Peabody LLP

(57) ABSTRACT

Laser device comprising:
 a laser source including a light emitting structure;
 a guide structure to deliver light generated by the emitting structure, this guide structure comprising at least a first portion and a second portion, the first portion housing a diffraction grating that forms a reflector of the laser source and cooperates with the emitting structure, the second portion being a waveguide that delivers light generated by the emitting structure and propagated in the first portion. The emitting structure is made using the III-V technology or II-VI technology, and the guide structure is made using the silicon technology.

24 Claims, 10 Drawing Sheets

(51) Int. Cl.
  *H01S 5/12* (2006.01)
  *H01S 5/125* (2006.01)

(56) References Cited

U.S. PATENT DOCUMENTS

| | | | |
|---|---|---|---|
| 6,031,860 A * | 2/2000 | Nitta et al. | 372/50.11 |
| 2003/0007765 A1* | 1/2003 | Sato et al. | 385/129 |
| 2003/0147442 A1* | 8/2003 | Larson et al. | 372/50 |

OTHER PUBLICATIONS

John Carroll, et al., "Distributed Feedback Semiconductor Lasers," The Institution of Electrical Engineers, SPIE Optical Engineering Press, London, U.K.

Fang, Alexander W. et al., "Electrically Pumped Hybrid AlGaInAs-Silicon Evanescent Laser," Optics Express, Optical Society of America USA, vol. 14, No. 20, Oct. 2, 2006, pp. 9203-9210.

Hyundai Park, et al., "Hybrid Silicon Evanescent Laser Fabricated with a Silicon Waveguide and III-V Offset Quantum Wells," Optics Express, Optical Society of America USA, vol. 13, No. 23, Nov. 14, 2005, pp. 9460-9464.

Tanaka T, et al., "Integrated External Cavity Laser Composed of Spot-Size Converted LD and UV Written Grating in Silica Waveguide on Si," Electronics Letters, IEE Stevenage, GB, vol. 32, No. 13, Jun. 20, 1996, pp. 1202-1203.

G. Allen Vawter, et al., "Monolithically Integrated Transverse-Junction-Stripe Laser with an External Waveguide in GaAs/AlGaAs," IEEE Journal of Quantum Electronics, vol. 25, No. 2, Feb. 1989, pp. 154-162.

* cited by examiner

LASER DEVICE WITH COUPLED LASER SOURCE AND WAVEGUIDE

CROSS REFERENCE TO RELATED APPLICATIONS OR PRIORITY CLAIM

This application is a national phase of International Application No. PCT/EP2007/063123, entitled "LASER DEVICE WITH COUPLED LASER SOURCE AND WAVEGUIDE", which was filed on Dec. 3, 2007, and which claims priority of French Patent Application No. 06 55313, filed Dec. 5, 2006.

TECHNICAL FIELD

This invention relates to the field of integrated photonic components that use the properties of semiconducting materials capable of emitting light and also the properties of semiconducting materials conventionally used in integrated circuits. More particularly, it is a laser device with coupled laser source and waveguide. Such a laser device may be used to make high speed optical links, and intra-chip and intra-card links, in free space.

STATE OF PRIOR ART

Traditionally, the development of microelectronic technologies respects Moore's law, particularly when they are based on silicon. Since integrated systems are becoming more and more complex, global electrical interconnections between chips are starting to form one of the bottlenecks slowing down integration progress. Limitations will occur mainly in terms of passband, energy consumption and integration density.

Alternative channels to be explored are beginning to appear, particularly optical interconnections that mainly allow an increase in the passband or the distribution of a very stable clock between different synchronous blocks.

The solution that is tending to become prevalent is to place an optical layer on top of integrated circuits to make global optical interconnections between chips. The silicon in which integrated circuits are manufactured is not suitable, because its light emission properties are not good enough. We are starting to find photonic components made from III-V or II-VI technology that cooperate with components made using silicon technology. Remember that III-V technology uses materials formed from elements in columns IIIb and Vb of the periodic table of chemical elements, namely B, Al, Ga, In, Tl, N, P, As and Sb. The II-VI technology uses materials formed from elements in columns IIb and VIb, namely Zn, Cd, Te, Se, O, S and Hg. The advantage of this approach is that it is absolutely compatible with the most mature industrial microelectronics and photonics technologies. In active optical components, at least laser sources are made using the III-V technology and passive optical components such as silicon or silicon based waveguides are made using the silicon technology. Some active components such as modulators or detectors may be made from germanium or based on germanium.

III-V epitaxial structures are usually added on to an SOI (silicon on insulator) substrate, by solid wafer bonding or vignetting, and they are then worked. However, it is still difficult to produce an electrically pumped laser source on a silicon substrate with good coupling efficiency. For the moment, we have firstly made the laser source with an amplifying cavity containing a medium that is light emitting when it is excited, and a waveguide is attached to it into which light that exits from the laser source is injected. The laser source and the waveguide are made adjacent. They are two independent components that can operate independently. Optimum alignment between the laser source and the waveguide is very difficult to obtain.

The "Monolithically Integrated Transverse-Junction-Stripe Laser with an External Waveguide in GaAs/AlGaAs" document by G. Allen Vawter et al., IEEE Journal of Quantum Electronics, vol. 25, No. 2, February 1989, pages 154-162, describes how a laser source is made monolithically above a waveguide on a gallium arsenide substrate. The laser source comprises an amplifying cavity with faces that act as mirrors and that have been chemically etched in the substrate. The laser source and the waveguide are independent. Coupling between the laser source and the waveguide is done by evanescent wave. The amplifying cavity is electrically pumped. It is very difficult to make mirrors etched in gallium arsenide, to obtain good reflection quality.

The "Hybrid silicon evanescent laser fabricated with a silicon waveguide and III-V offset quantum wells" document by Hyundai Park et al., Optics Express, vol. 13, No. 23, Nov. 14, 2005, pages 9460-9464, describes a laser source made of an III-V material added onto an SOI substrate in which a rib-shaped waveguide is formed. Coupling between the laser source and the waveguide is done by evanescent waves. Mirrors limiting the cavity are made by sawing and polishing. The laser source and the waveguide are independent. The amplifying cavity is optically pumped. The disadvantage of this structure is in production of the mirrors, a so-called "polishing-sawing" step is necessary, and polishing and sawing are done simultaneously. Polishing-sawing is very difficult to achieve, it is a non-collective method that is difficult to perform industrially.

French patent application FR-A-2 826 789 also discloses a laser integrated with a modulator, an amplifier or a filter into a single substrate, in which a light emitting structure and also a diffraction grating are made using the III-V technology, and are put end to end. Nothing is made using the silicon technology, and this optical component should be associated with a component using the silicon technology with the disadvantages mentioned above.

PRESENTATION OF THE INVENTION

The purpose of this invention is to disclose a laser device that does not have the disadvantages mentioned above.

One particular purpose is to make a laser that can be used efficiently with an integrated circuit using the silicon technology.

Another particular purpose is to propose such a laser device with improved coupling between the waveguide and the laser source.

Yet another purpose is to make a laser device that does not require a mirror etching step in the III-V material.

More precisely, the invention relates to a laser device comprising the following, to achieve these purposes:

a laser source including a light emitting structure, a guide structure to deliver light generated by the emitting structure, this guide structure comprising at least a first portion and a second portion, the first portion housing a diffraction grating that forms a reflector of the laser source and cooperates with the emitting structure, the second portion being a waveguide that delivers light generated by the emitting structure and propagated in the first portion, the emitting structure made using the III-V technology or II-VI technology, and the guide structure made using the silicon technology.

The guide structure and the light emitting structure are stacked one on the other.

The guide structure has a core surrounded by a cladding, the emitting structure and the core are separated by the cladding of the guide structure. The core of the guide structure in the first portion forms the diffraction grating. The core of the guide structure in the second portion is the waveguide core.

The core of the guide structure in the second portion is made of silicon and not from an III-V or an II-VI material.

The core of the guide structure in the first portion comprises zones made of the same material as the core in the second portion, these zones being alternated with zones made of dielectric material.

The laser source is preferably electrically pumped.

The core of the guide structure at the second portion may have an approximately constant refraction index.

The diffraction grating is a distributed mirror type reflector.

The diffraction grating may comprise a phase shifter.

The guide structure may comprise a third portion forming an adiabatic passage between the first portion and the second portion.

The emitting structure may be a stack comprising, starting from the guide structure, a second electrical contact making layer, a second layer forming the cladding, a second spacer layer, an active layer, a first spacer layer, a first layer forming the cladding, and a first contact making layer.

Each contact making layer may cooperate with an electrical contact strip.

This invention also applies to a method for making at least one laser device comprising a laser source comprising a light emitting structure and a guide structure to deliver light generated by the emitting structure. It comprises the following steps:

make the guide structure using the silicon technology with at least a first portion in which a diffraction grating is inscribed and a second portion that is a waveguide, assembly of the emitting structure and the guide structure by molecular bonding, such that the diffraction grating is a laser source reflector and the second portion outputs light generated by the emitting structure.

The guide structure may be made from an SOI substrate with two silicon layers separated by a dielectric layer, one of the silicon layers being thinner than the other, the guide structure having a core made in the thinnest silicon layer.

The diffraction grating may be obtained by etching grooves in the thinnest silicon layer and filling in with dielectric material.

It is planned to deposit a layer of embedding material on the core of the guide structure to embed it.

The emitting structure may be made on a substrate made of a III-V or II-VI material, by stacking a sequence of layers starting from the substrate, to obtain a first contact making layer, a first layer forming a cladding, a first spacer layer, an active layer, a second spacer layer, a second layer forming the cladding, a second electrical contact making layer, these layers being made of III-V or II-VI materials.

The active layer may be made by stacking several sub-layers to obtain one or several quantum wells.

A stop layer may be deposited on the substrate, before the first contact making layer.

It is also planned to eliminate the substrate made of III-V or II-VI material, stopping on the stop layer after assembly.

It is also planned to eliminate the stop layer, after eliminating the III-V or II-VI substrate.

A bond layer may be made on the second contact layer before assembly onto the guide structure.

Preferably, there is a polishing step of the bond layer and the layer of embedding material to facilitate assembly.

At least a first electrical contact strip is deposited on the first contact making layer.

At least one zone of the second contact making layer is exposed before at least one second electrical contact strip is deposited on it.

If several laser devices are made simultaneously, the emitting structure can be subdivided into several portions by etching of the second electrical contact making layer.

BRIEF DESCRIPTION OF THE DRAWINGS

This invention will be better understood after reading the description of example embodiments given purely for guidance and in no way limitative, with reference to the appended drawings among which.

Identical, similar or equivalent parts of the different figures described below have the same numerical references, to facilitate cross-references between different figures.

The different parts shown on the figures are not necessarily at the same scale, to make the figures more easily understandable.

DETAILED PRESENTATION OF PARTICULAR EMBODIMENTS

Figure 1A:
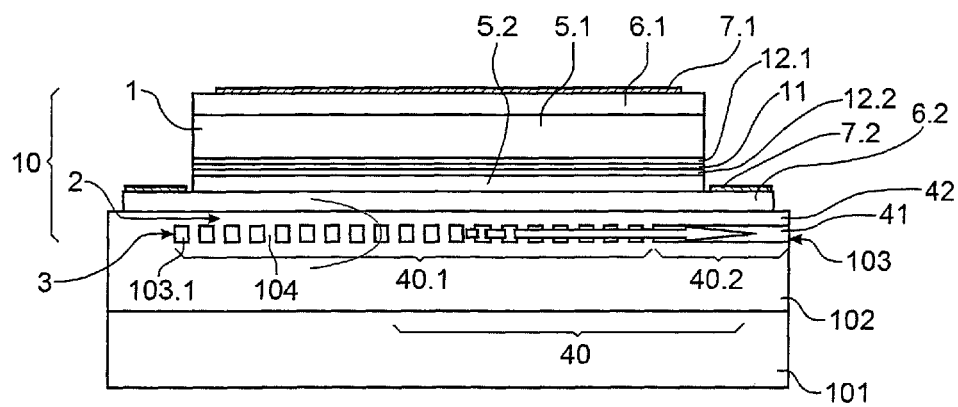
FIGS. 1A, 1B show a sectional and top view of an example of a laser device according to the invention, FIG. 1C showing details of the active layer of the emitting structure.
Figure 1B:
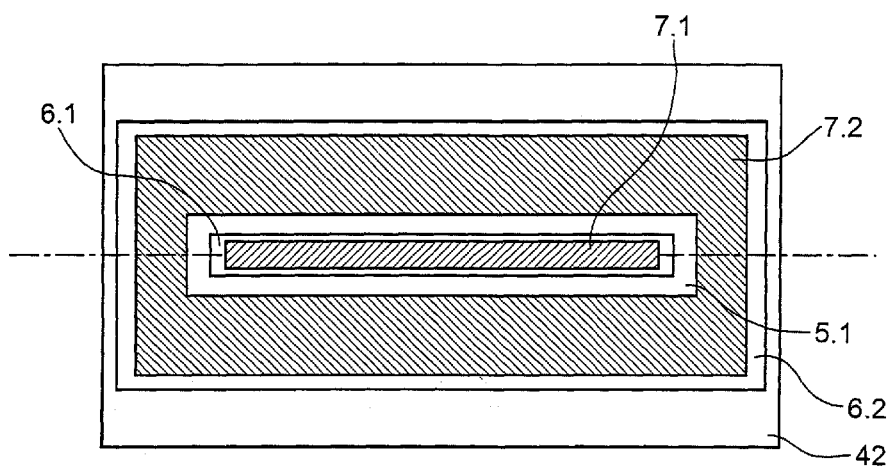

We will now refer to FIGS. 1A and 1B that show a laser device according to the invention in sectional and top views.

This laser device comprises a laser source 10 and a guide structure 40 in which a laser beam (shown diagrammatically by the arrow F in FIG. 1A) emitted by the laser source 10, can be propagated. The laser source 10 includes an emitting structure 1, cooperating with an amplifying cavity 2. This emitting structure 1 has one or several quantum wells and it can emit light when it is excited. This emitting structure 1 is made using an III-V or II-VI technology. The emitting structure 1 cooperates with a reflector that is formed by one or several diffraction gratings 3 to complete the amplifying cavity 2.

By making a suitable choice of the parameters of diffraction gratings 3, a DFB (Distributed Feed Back) or distributed mirrors laser source 10, or a DBR (Distributed Bragg Reflectors) source can be obtained. The laser source shown in FIGS. 1A, 1B is distributed feed back, while the source in FIG. 5C is a distributed Bragg reflectors source. This FIG. 5C will be described later. The cavity 2 shown in FIG. 1 is distributed along a single diffraction grating 3.

Such diffraction gratings used in monolithic lasers do not create any problem for those skilled in the art who can for example refer to the general book "Distributed feedback semiconductors lasers" by J. Caroll, J. Whiteaway, D. Plumb, SPIE Press 1998, SPIE IBSN: 08194 2660 1.

When the emitting structure 1 emits light, this light is coupled to the diffraction grating 3 by evanescent wave. This light is modulated by the diffraction grating 3 that is subjacent to the emitting structure 1. The optical mode that arises in the emitting structure 1 at an active layer 11 projects on each side of this active layer 11. The optical profile of the mode is shown in FIG. 1A.

According to one characteristic of this invention, the diffraction grating 3 is integrated into the guide structure 40. More precisely, the guide structure 40 comprises at least one first portion 40.1 in which the diffraction grating 3 is inscribed and a second portion 40.2 that is a waveguide, that emits the laser beam outside the laser source 10. The second portion 40.2 is located on the output side of the first portion 40.1. The guide structure 40 comprises a core 41 contained in a cladding 42, the core in the first portion 40.1 forms the diffraction grating 3. The core 41 in the second portion 40.2 of the guide structure is the core of the waveguide, and it has an approximately constant refraction index. The emitting structure 1 and the core 41 of the guide structure 40 are separated by the cladding 42 of the guide structure 40.

The diffraction grating 3 corresponds to a part with a periodic variation of the refraction index of the core of the guide structure, and it is formed from an alternating succession of one or several first zones 103.1 with a first refraction index and one or several second zones 104 with a second refraction index different from the first refraction index. Preferably, it has an approximately constant pitch.

Light is emitted from the laser source 10 and propagates into the guide structure 40 from the first portion 40.1 housing the diffraction grating 3 to the second portion 40.2 of the guide structure 40.

The guide structure 40 is made using the silicon technology. The core 41 of the guide structure 40 in the second portion 40.2 that is adjacent to the diffraction grating 3 is made of silicon, this choice is made because the core does not need good light emission properties, unlike the emitting structure 1.

At the diffraction grating 3, it is planned that the first zones 103.1 should also be made of silicon. The second zones 104 are also made of a dielectric such as silicon dioxide or silicon nitride. A material that does not absorb light or only absorbs a small amount of light is chosen for the second zones 104, with a refraction index that has the largest possible difference from the index for the first zones. The refraction indexes of the first zones 103.1 are larger than the refraction index of the second zones 104.

The different portions 40.1, 40.2 of the guide structure 40 will be made at the same time by common steps.

Among the emitting structure 1 and the guide structure 40, only the emitting structure 1 is made using the III-V or II-VI technology. This can give the gain for the laser source 10. The guide structure 40 does not use an III-V or II-VI technology. This structure has an advantage compared with prior art because there is no need to make the reflector from a III-V or II-VI material, which is always a difficult operation.

The diffraction grating 3 acts as a coupler to the second portion 40.2 of the guide structure 40 and as a reflector for the amplifying cavity 2. Therefore, the emitting structure 1 is the amplifying medium of the laser source 10 and the diffraction grating 3 is a reflector that gives the laser effect.

Figure 5A:
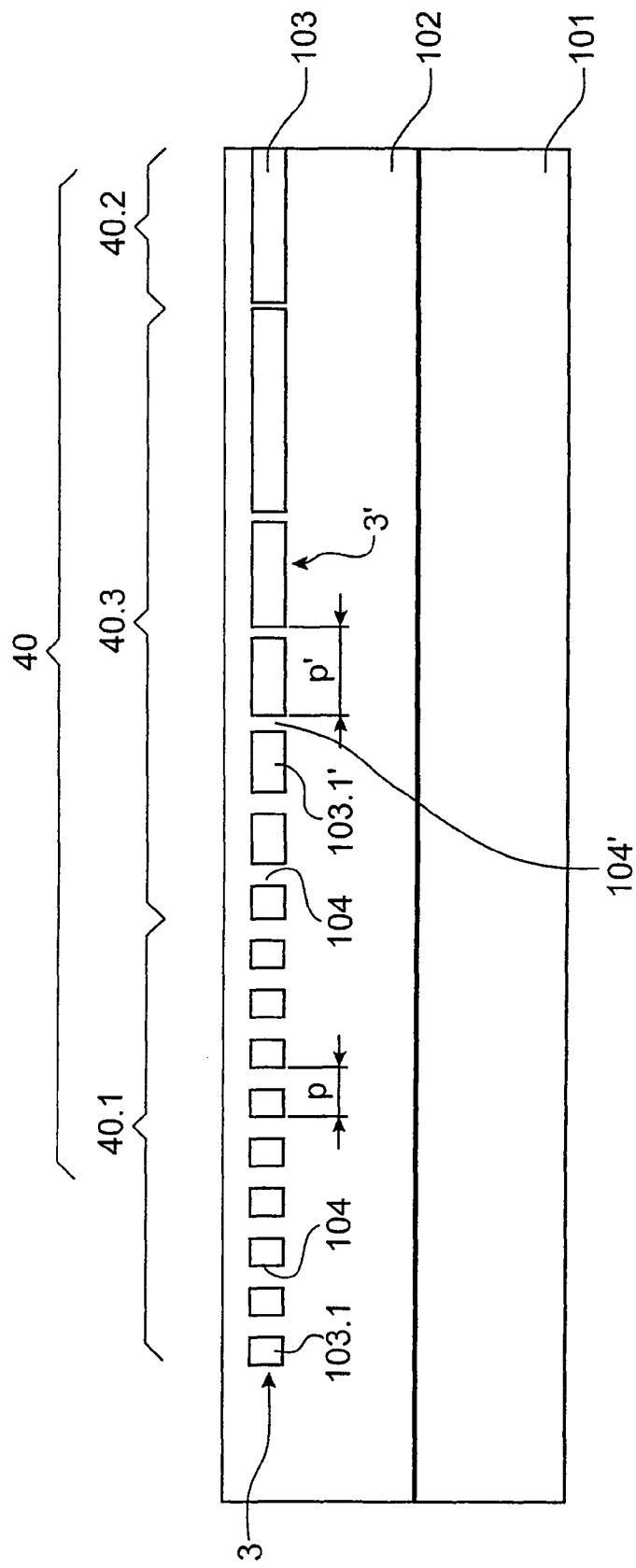
FIGS. 5A to 5C show several example variants of the guide structure.
Figure 5B:
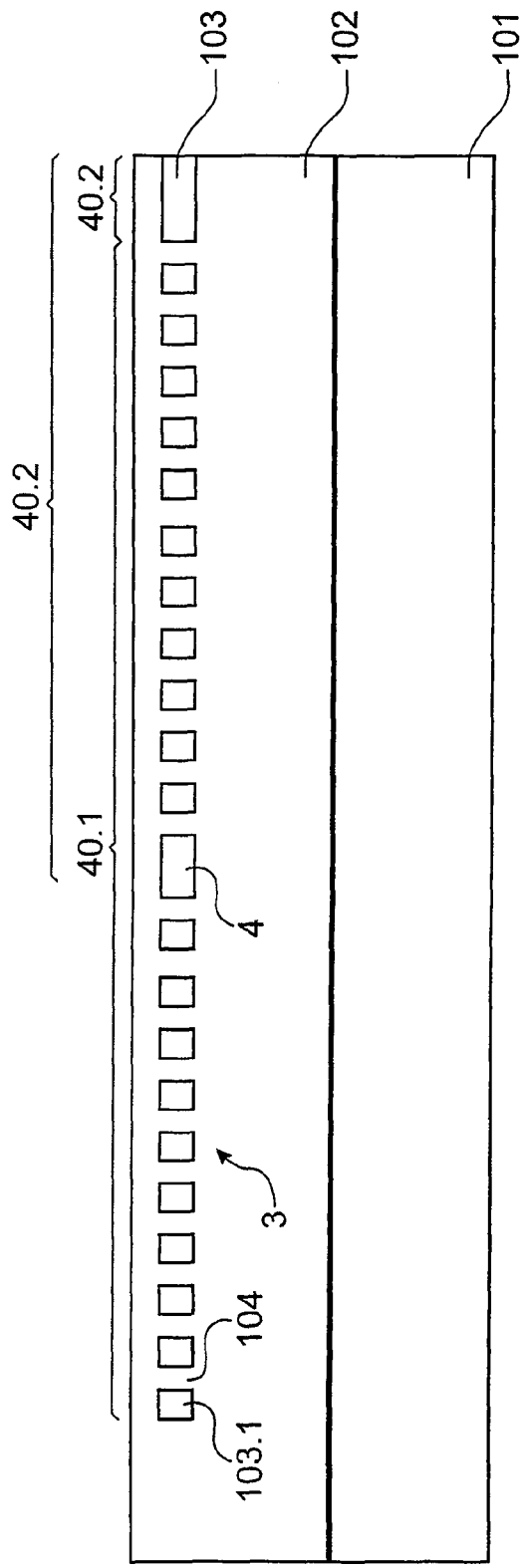
Figure 5C:
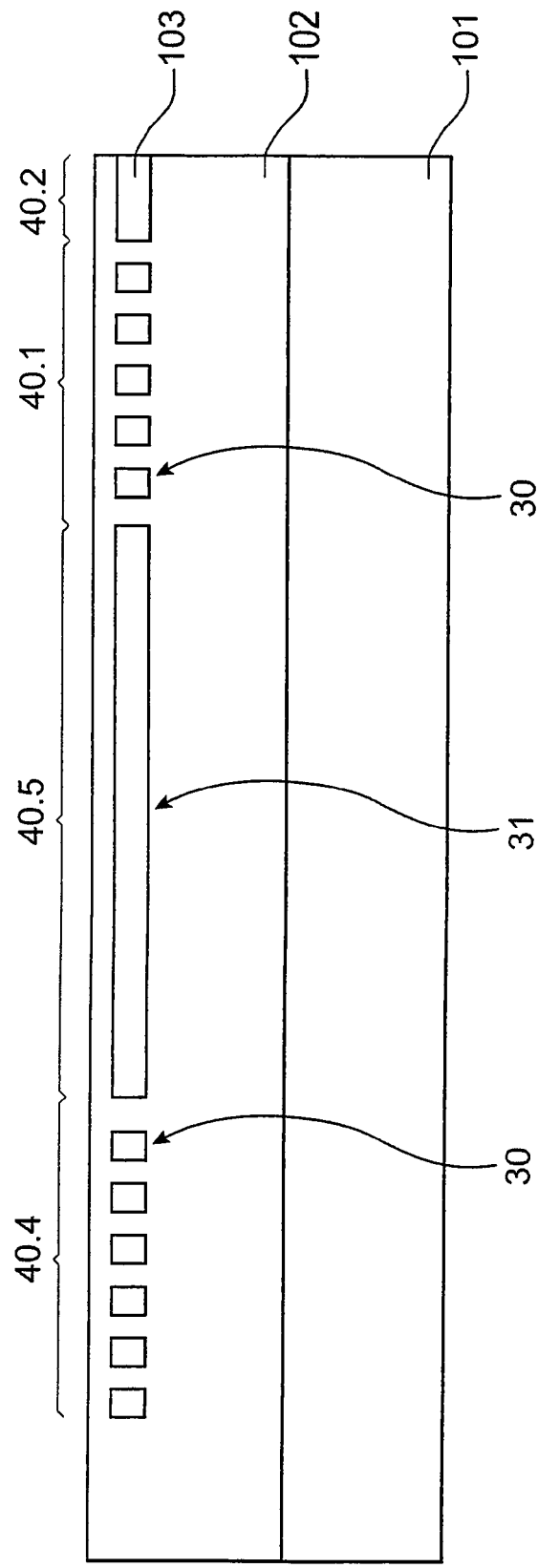

We will now consider variants of other examples of the guide structure 40 with reference to FIGS. 5A to 5C.

In FIG. 5A, the guide structure 40 comprises an intermediate portion 40.3 inserted between the first portion 40.1 and the second portion 40.2. This intermediate portion 40.3 houses an adiabatic transition 3' between the diffraction grating 3 and the waveguide 40.2. This adiabatic transition 3' is located at the core of the guide structure 40, it is made from an alternating sequence of first zones 103.1' and second zones 104' with different refraction indexes like those of the diffraction grating 3, but in this case the alternation pitch is no longer constant, it increases gradually from the diffraction grating 3 towards the waveguide 40.2. The pitch of the diffraction grating 3 is denoted p, and the pitch of the adiabatic transition 3' is denoted p'. Furthermore, apart from the increase in the pitch p', there is a concomitant reduction in the second zone 104'. This third portion 40.3 adapts modes between the mode of the first portion 40.1 and the mode of the second portion 40.2.

FIG. 5B shows a phase shifter 4 within the diffraction grating 3. This phase shifter 4 is located in a central zone of the diffraction grating 3. This phase shifter 4 located between two second zones 104 is made from the material of the first zones 103.1, which in our example is silicon. It will be longer than a first zone 103.1, and preferably this length will be approximately double.

As already mentioned, FIG. 5C shows the guide structure 40 comprising first and second portions 40.1, 40.2, the second portion 40.1 being completed by two additional successive portions 40.4, 40.5, the first 40.4 including a second refraction grating 30 and the second 40.5 including an amplifying cavity 31. The second diffraction grating 30 and the amplifying cavity 31 are formed by the core 41 of the guide structure 40. The amplifying cavity 31 is located between the first diffraction grating 3 in the first portion 40.1 and the second diffraction grating 30 in the first additional portion 40.4. The two diffraction gratings 3 and 30 are preferably identical. The cavity 31 is made from the material of the first zones 103.1, silicon in the example described, and its length is much longer than the lengths of the first zones in the diffraction gratings, and even greater than the length of the phase shifter.

Figure 3:
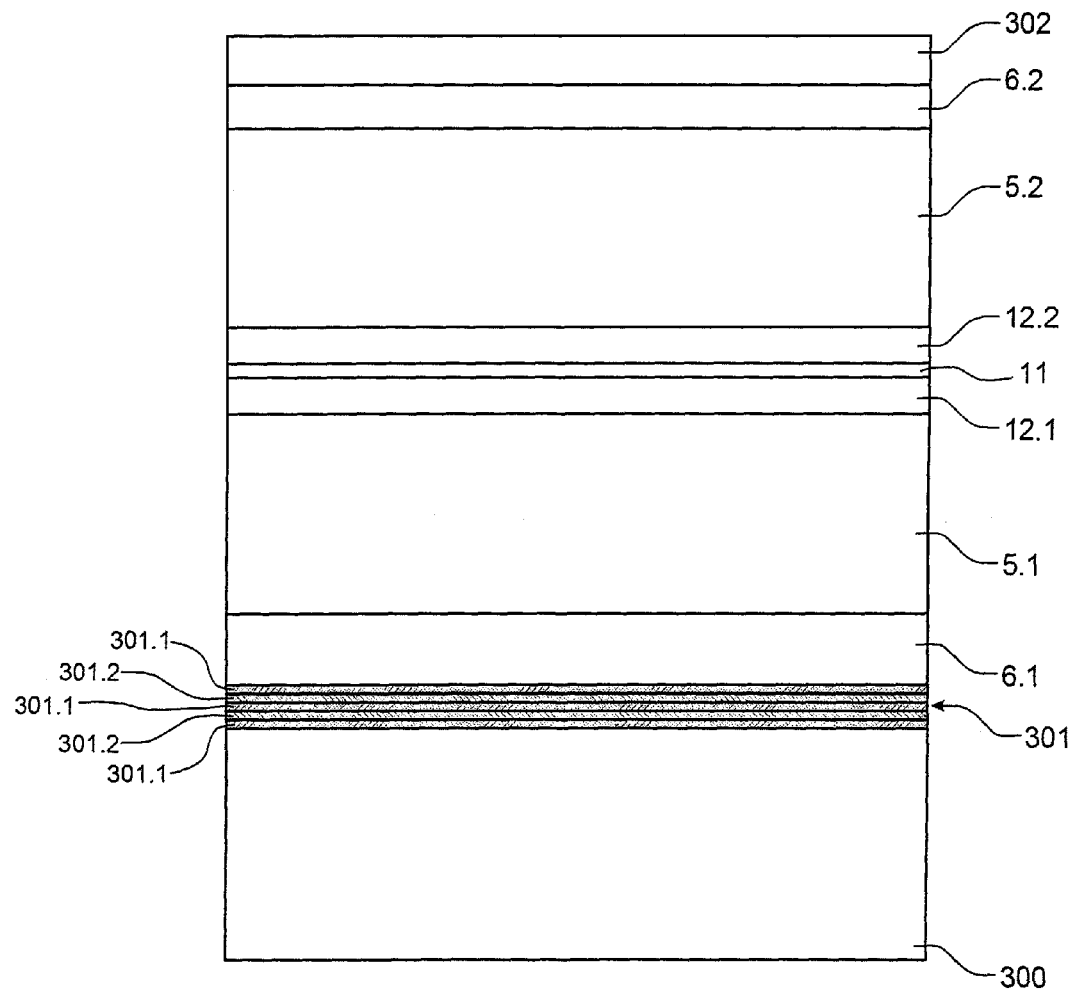
FIG. 3 shows a section of an example emitting structure during manufacturing.

The emitting structure 1 comprises a stack of layers shown in FIG. 3, with an active layer 11 with one or several quantum wells inserted between a first spacer layer 12.1 and a second spacer layer 12.2. The emitting structure 1 comprises spacer layers 12.1, 12.2 above and below, first and a second layers 5.1, 5.2 forming a cladding.

Figure 1C:
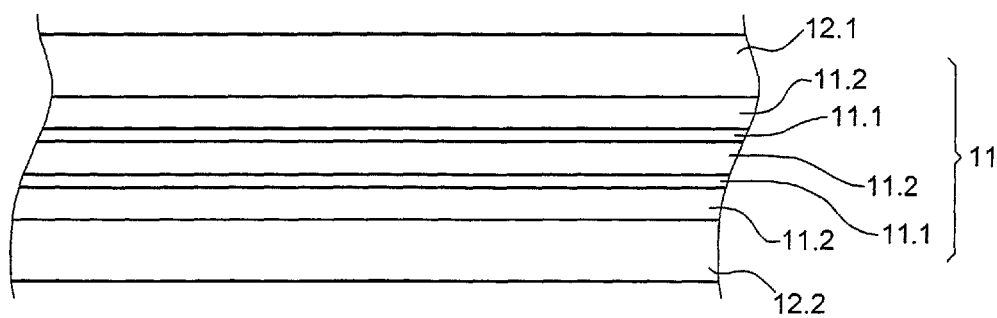

If the active layer 11 only has one quantum well, it is then formed from a sub-layer of InGaAs, for example, sandwiched between two sub-layers made for example from GaAs. Similarly, if the active layer 11 comprises several quantum wells, it is formed from an alternating stack of sub-layers made from GaAs and InGaAS; for m quantum wells, there will be m layers made from InGaAs 11.1 and m+1 layers made from GaAs 11.2. FIG. 1C shows the active layer 11 with two quantum wells with its sub-layers 11.1, 11.2 sandwiched between the spacer layers 12.1, 12.2, in more detail.

The stack of the emitting structure 1 is terminated by first and second layers 6.1, 6.2 making an electrical contact used for electrical polarisation of the active layer 11. These contact making layers 6.1, 6.2 have different doping types. The first and second layers 5.1, 5.2 forming a cladding are also doped and they have different doping types. The first contact making layer 6.1 and the first layer 5.1 forming cladding have the same type of doping. The same is true for the second contact making layer 6.2 and the second layer 5.2 forming the cladding. It is assumed that the second contact making layer 6.2 has an n+ type doping and the first contact making layer 6.1 has a p+ type doping. Obviously, the opposite would be possible. The same is true for all doped layers, and all doping types could be reversed. The contact making layers 6.1, 6.2 cooperate with contact strips 7.1, 7.2 respectively, for each emitting structure.

For example, the contact making layers 6.1, 6.2 could be made of gallium arsenide doped for example with silicon for n+ type doping and doped for example with carbon for p+ type doping. Concentrations of n+ type doping could be of the order of $3E18.cm^{-3}$ and concentrations of p+ type doping could be of the order of $3E19.cm^{-3}$. Their thickness could be of the order of 100 nm.

The active layer 11 is not doped. The thickness of its sub-layers 11.2 may be about 20 nanometers and the thickness of its sub-layers 11.1 may be about 7 nanometers.

The two spacer layers 12 may for example be made of non-doped GaAs and may be of the order of 100 nanometers thick.

The layers 5.1, 5.2 forming the cladding may for example be made of $Ga_{0.7}Al_{0.3}As$, for example they will be doped with silicon for the n type layer, and carbon for the p type layer, and the concentration of their doping may be of the order of $5E17.cm^{-3}$. In the example described, their thickness is of the order of 1.7 micrometers for the layer furthest from the diffraction grating 3, and of the order of 500 nm for the layer closest to the diffraction grating 3. With such different thicknesses, the structure is dissymmetric and the optical mode is offset towards the diffraction grating 3.

The stack is made on a substrate using III-V or II-VI technology 300, for example gallium arsenide GaAs not intentionally doped or indium phosphide InP.

Other examples of materials for the emitting structure will be given. They may be alloys of elements in columns IIb and VIb in the periodic table of chemical elements, for example such as ZnO and ZnSe or alloys of nitrogen N with an element in column IIIb in the periodic table of chemical elements, for example such as GaN or GaAlN. An alloy means a compound of a metal or a metalloid with one or several other elements.

Figure 2A:
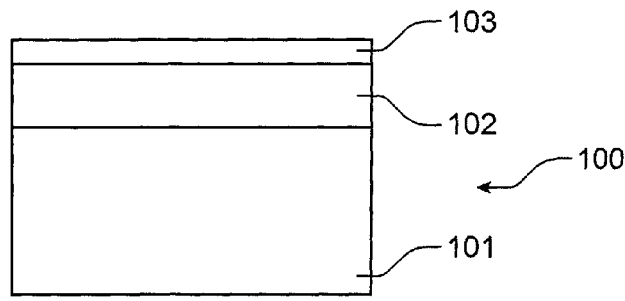
FIGS. 2A, 2B, 2C, 2D show different views of an example guide structure during its manufacturing.

The guide structure 40 in which the diffraction grating 3 is inscribed may be formed from a substrate SOI shown in FIG. 2A. Such an SOI substrate 100 conventionally comprises a layer of silicon dioxide 102 sandwiched between two silicon layers 101, 103, for which one (reference 103) is thinner than the other. The thinner layer 103 is made from polycrystalline, monocrystalline or even amorphous silicon. As a variant, those skilled in the art could easily manage without an SOI substrate and create a guide structure from silicon and a dielectric.

However, it is assumed that the example described uses an SOI substrate. The core 41 of the guide structure 40 is formed at the thinnest layer 103 of silicon.

One side of the cladding 42 is formed from the insulating layer 102 of the SOI substrate 100 and the other sides by an infill material 104 and embedding material 105.

Since the diffraction grating 3 is a part of the core of the guide structure 40, it uses the thinnest layer of silicon 103 of the SOI substrate 100, and also the infill material 104. It operates based on the principle of periodic variations of refraction indexes as we have already seen, the refraction indexes being the values for silicon in the thinnest layer 103 and of the infill material 104 which in the example described is silicon dioxide. Periodic recessed patterns are made in the silicon layer 103, for example composed of approximately rectangular and parallel grooves that are filled with the infill material 104. These grooves may or may not expose the silicon dioxide layer 102. During this step, the shape of the core 41 of the second portion 40.2 of the guide structure 40 that forms the waveguide, is created. The result is then an alternating sequence of first zones 103.1 that are silicon bands and second zones 104 that are grooves full of infill material. The embedding material 105 contributes to terminating the cladding of the guide structure 40 and therefore to embedding the diffraction grating 3 and the core of the waveguide.

The infill material 104 may be the same as the embedding material 105 (for example silicon dioxide) or it may be different (for example silicon nitride). The embedding material 105 is also used to facilitate bond between the guide structure 40 and the emitting structure 1. The reference 105 indifferently represents the embedding layer and the embedding material.

The layer 102 of silicon dioxide in the SOI substrate 100 may be of the order of 3 micrometers thick, the thinnest silicon layer 103 of the SOI substrate 100 may be of the order of about 220 nanometers thick. The infill material 104 has approximately the same thickness. The embedding layer 105 may also be of the order of 100 nanometers thick. There are no constraints on the thickness of the other silicon layer 101 in the substrate.

The diffraction grating 3 acts as a distributed mirror. It works in the first order. In one advantageous embodiment shown in FIG. 2D, the width L of the core of the guide structure 40, in other words the width of the diffraction grating 3 and also the width of the core of the waveguide in the second portion 40.2, may be 540 nanometers for a working wavelength λ equal to 1310 nanometers and 500 nanometers for a wavelength λ equal to 1550 nanometers. The filling factor may be 0.5, which means that the first zones 103.1 will be at a spacing equal to their width D. For a wavelength λ of 1310 nanometers, this width D is equal to about 185 nanometers, and for a wavelength λ equal to 1550 nanometers, this width D is equal to about 240 nanometers. These values correspond to an example, and they are only given for guidance. Obviously, other numerical values would be possible.

In patent application FR-A-2 826 789, the diffraction grating was directly made from a portion of the active layer of the light emitting structure.

In the laser device according to the invention, the diffraction grating 3 and the light emitting structure 1 are stacked one on the other.

We will now describe an example process for making a laser device according to the invention in further detail. The guide structure and the laser source emitting structure will be made separately. The laser source 10 and the guide structure 40 do not operate independently, the first portion of the guide structure 40 is integrated into the laser source 10 and cooperates with the emitting structure, and integrates the diffraction grating.

In the example described, the guide structure 40 and therefore the diffraction grating are made from an SOI substrate 100 shown in FIG. 2A. It may be a wafer made using the CMOS technology with a diameter of the order of 200 millimeters, on which one or several waveguides are made. In this context, the size of the emitting structure may be about one centimeter by one centimeter on the wafer.

The contour of the core 41 of the guide structure 40, in other words the core of the waveguide and the patterns of the diffraction grating 3 of the first portion 40.1, will be delimited by lithography followed by an etching step in the thinnest layer 103. If the guide structure comprises other portions like that housing the adiabatic transition or the portion housing the cavity and the portion housing the second diffraction grating, the core of these portions will be delimited in the same manner. These variants are not shown, for reasons of clarity.

Figure 2B:
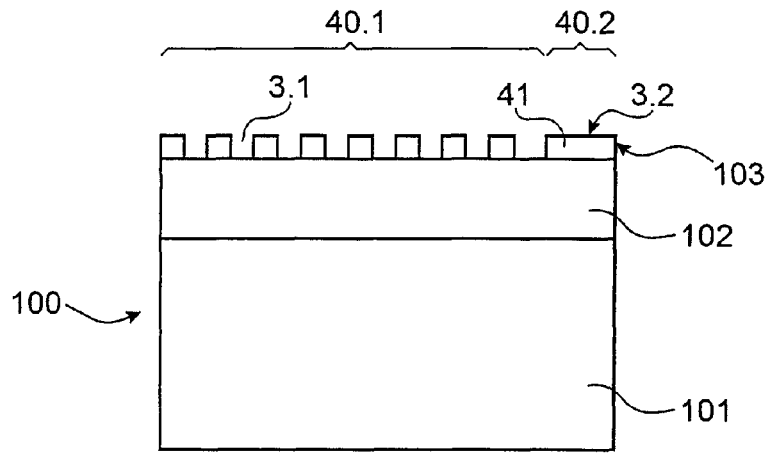
Figure 2C:
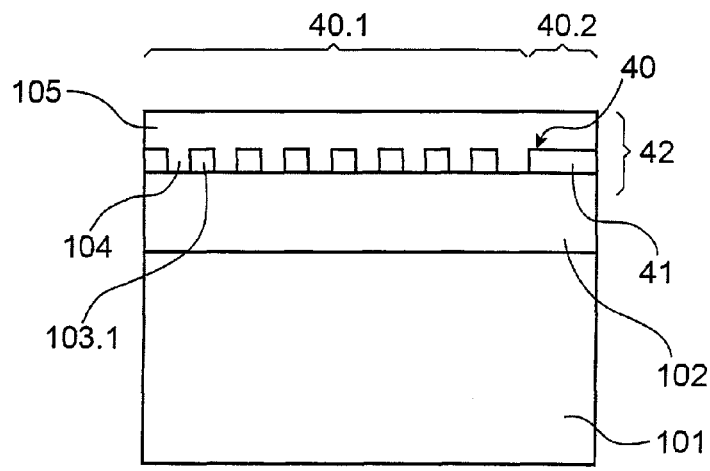

The etching shown in FIG. 2B may be dry etching by plasma, referred to as RIE (reactive ion etching). This is done by making a series of approximately parallel grooves 3.1 in the silicon layer 103 in the first portion to make the diffraction grating, and an approximately perpendicular ribbon 3.2 in the second portion. In FIG. 2B, the etching stops on the silicon dioxide layer 102, but this is not compulsory, it could stop in the silicon layer 103. The next step will be to deposit the infill material 104 to complete the diffraction grating, this infill material filling in the grooves 3.1. Refer to FIG. 2C. This infill material 104 also surrounds the sides of the ribbon 3.2. The next step is to embed the diffraction grating and the ribbon, by covering it with embedding material 105. This embedding material 105 contributes to forming the cladding 42 of the guide structure.

Figure 2D:
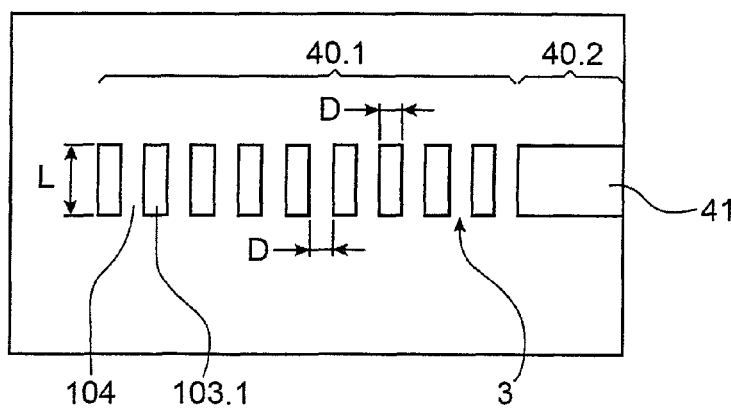

The infill material 104 and the embedding material 105 can only be deposited in a single step. This material, that is silicon dioxide in the example, can be deposited by PECVD (Plasma Enhanced Chemical Vapour Deposition). This is shown in FIGS. 2C and 2D. This embedding layer 105 made of silicon dioxide is also used as a bond layer.

It is preferable to include a flattening step to improve bond, for example by mechanical-chemical polishing of the embedding layer 105. The total thickness of the embedding layer 105 may be of the order of 100 nanometers, while typically 1.5 micrometers of silicon dioxide may have been deposited for infill and for embedding. This flattening step can be done using wet felt. Thus, polishing activates the embedding layer 105 and facilitates bond of the emitting structure 1 as will be seen later. However, it will be organised such that the embedding layer 105 is as shallow as possible.

The emitting structure 1 is also made using an III-V or II-VI technology by MOCVD (Metal-Organic Chemical Vapour Deposition) type epitaxy, or by MBE (Molecular Beam Epitaxy) onto a substrate for example made from GaAs, reference 300 in FIG. 3, that is not intentionally doped. The thickness of the substrate 300 is not restrictive, it is a sacrificial substrate and its elimination should not be too difficult. Those skilled in the art will find it easy to grow the layers mentioned above on such an appropriate substrate 300, namely in order from the substrate 300, the first contact making layer 6.1, the first layer forming the cladding 5.1, the first spacer layer 12.1, the active layer 11, the second spacer layer 12.2, the second layer forming the cladding 5.2, the second contact making layer 6.2.

It is preferable to include a stop layer 301 between the substrate 300 and the first contact making layer 6.1, that will subsequently facilitate removal of the substrate 300 without etching the first contact making layer 6.1. The stop layer 301 may be a "super grating", in other words a periodic multi-layer formed by repetition of an elementary pattern composed of successive chemically different layers. There may be sub-layers of GaAs and AlAs, references 301.1, 301.2 respectively. Consequently, there can be five sub-layers of each material in an alternating stack. The total thickness of each sub-layer 301.1, 301.2 is about 100 nanometers.

We will then cover the second contact making layer 6.2 with a silicon dioxide bond layer 302, for example to facilitate bond with the guide structure. This bond layer 302 will be as thin as possible, for example about 200 nanometers. The silicon dioxide in the bond layer 302 may be deposited by PECVD. As before, the bond layer 302 can be mechanically-chemically polished, for example with wet felt to activate its surface.

Figure 4A:
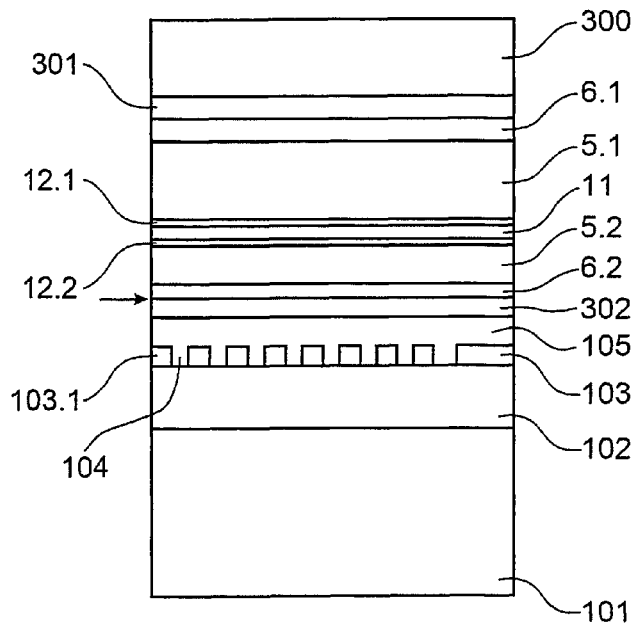
FIGS. 4A to 4F show different steps in making an example of a laser device according to the invention starting from the assembly of the emitting structure to the guide structure.

The next step will be to create mechanical contact between the two activated faces and assemble them by molecular bonding. Molecular bonding is a technology for the assembly of two materials that is increasingly used in microelectronics and micro technologies. It is based on spontaneous bond of two surfaces independently of their corresponding crystalline structures, when they are sufficiently flat and not very rough. Bonding is done by propagation of a mechanical wave. It is shown in FIG. 4A. The bonding interface is shown by the arrow. Preferably, annealing will be done for several hours at a temperature between about 200° C. and 600° C., to strengthen the bond.

Figure 4B:
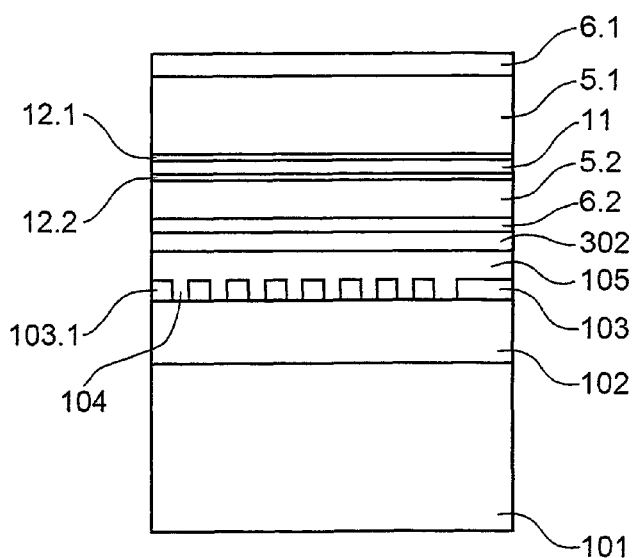

The substrate 300 used to make the emitting structure 1 will then be eliminated. This elimination may be done in several steps, firstly thinning by grinding then mechanical polishing down to a thickness of about 50 micrometers, then chemical etching for example with a citric acid-based solution and selective stop on the stop layer 301. The next step is to eliminate the stop layer 301, for example by selective chemical etching, for example with a hydrochloric acid-based solution. Refer to FIG. 4B.

Figure 4C:
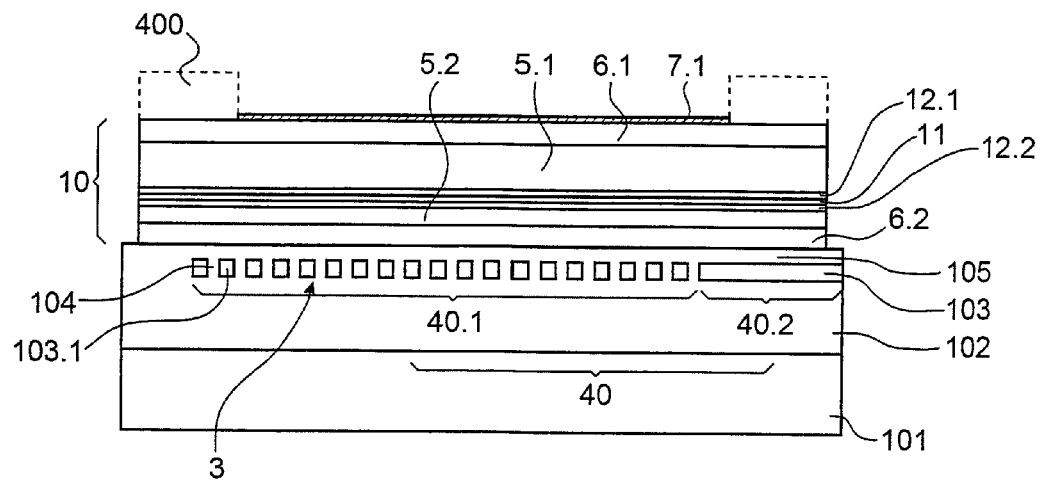

All that remains to be done is to make the electrical contact strips 7.1, 7.2 on the two contact making layers 6.1, 6.2. The first step could be to make the contact strip 7.1 that cooperates with the first contact making layer 6.1 and that is located at the top of the emitting structure 1. For example, it could be a Ti—Pt—Au multi-layer if it is of the p type. It can be made by deposition-lift off. The III-V or II-VI components technology is distinguished from the silicon technology by the use of metals that are difficult to etch. Consequently, unlike the silicon technology in which an electrical contact strip is made by depositing a metallic film over the entire surface of the sample and then eliminating the undesirable parts by etching through a resin mask, with the deposit-lift off technology, a resin mask 400 is made before the metal is deposited and the metal is deposited only in the required portions. The required contact strip 7.1 is obtained by eliminating the mask and the metal that was deposited on its surface. The metallic deposit can be made by evaporation. The outline of the resin mask is shown in dashed lines as reference 400 in FIG. 4C.

Figure 4D:
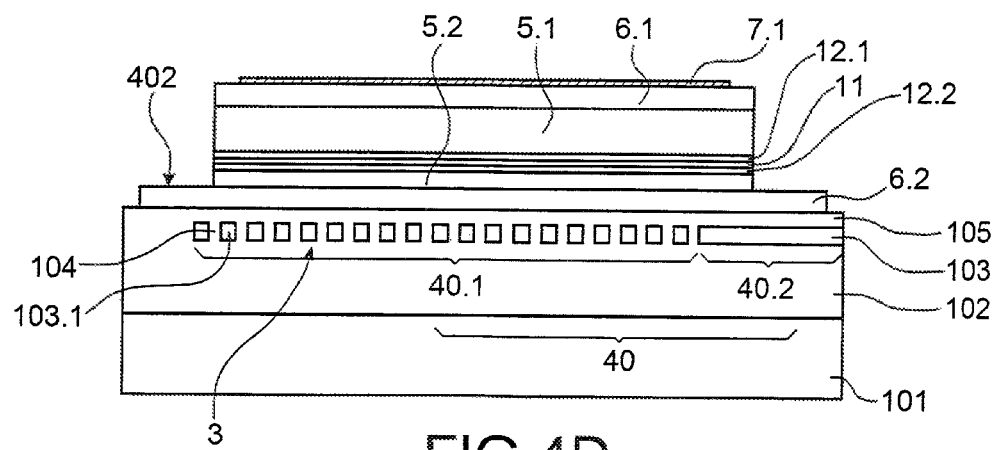

The second contact strip 7.2 that cooperates with the second contact making layer 6.2 is made by locally exposing this second contact making layer 6.2 to reach its surface on at least one zone 402. Refer to FIG. 4D. This local exposure of the second contact making layer 6.2 can be done by etching, for example RIE (reactive ion etching) or chemical etching. This is equivalent to making a mesa that delimits a pattern of the active part 10. It can be made in the shape of a ribbon. Several distinct active parts can thus be delimited on each side, if several waveguides are provided.

Figure 4E:
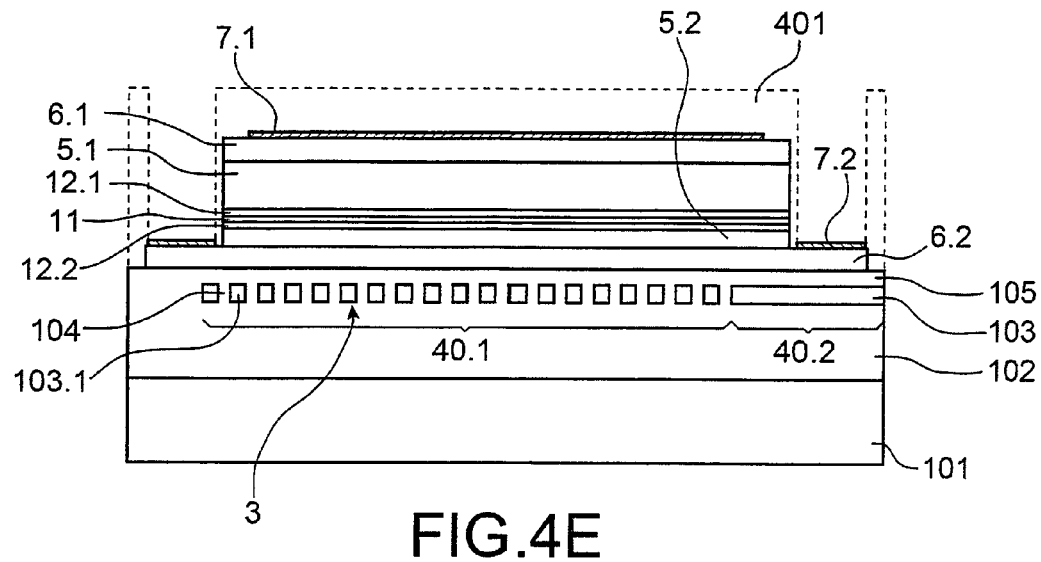
Figure 4F:
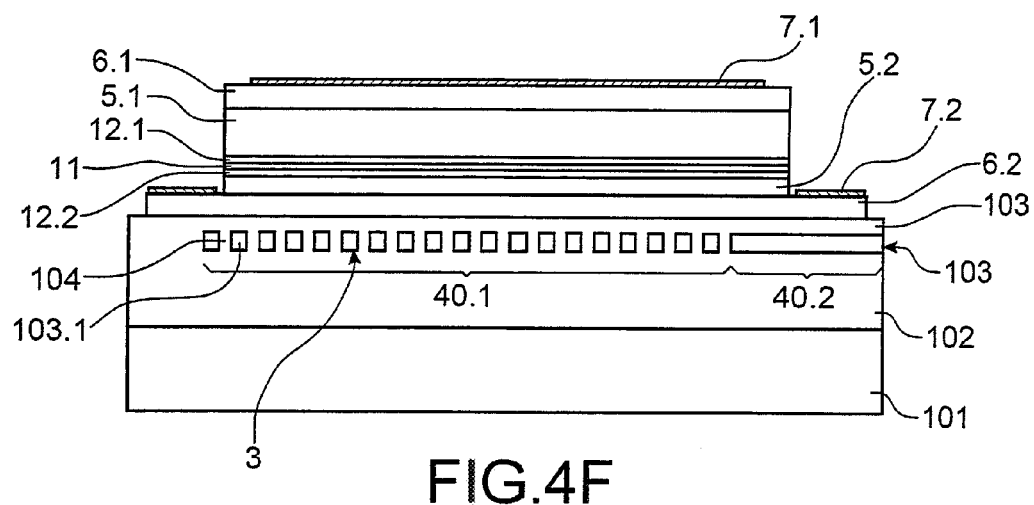

The next step is to make the second contact strip 7.2 for each laser device on the zone of the second contact making layer 6.2 that has been exposed. Refer to FIG. 4E. This second contact strip 7.2 can also be made by lift-off at the bottom of the etching. The mask used is outlined in dashed lines and it is marked as reference 401 in FIG. 4E. This mask 401 also covers the mesa. If the second contact strip 7.2 is of the n type, it can be made by an Ni—Ge—Au—Ni—Au multi-layer. A fast annealing will preferably be done on the contact strips 7.1, 7.2 to inter-diffuse the species, for example at a temperature of between about 350° C. and 450° C. for a few minutes.

If there are several emitting structures on the substrate 101, a step to isolate emitting structures from each other can be adopted, namely a step to etch the second contact making layer 6.2 until the embedding material 105 is exposed. This etching is done beyond the second contact strip 7.2, from the mesa. This etching can be done by reactive ionic etching. The emitting structure made is thus subdivided into several parts and is shown in 4F.

The order of the steps that has just been described is not limitative, for example the etching step aimed at electrically isolating several emitting structures can be done before making the second contact strip 7.2 or before making the etching to expose the second contact making strip 6.2 before making the first contact strip 7.1 or even making the second electrical contact strip before the first electrical contact strip is made.

In conclusion, the laser source is intrinsically coupled into the guide structure. It is pumped electrically. The laser source and the waveguide are not independent as they were in prior art. We can refer to a coupled laser device.

Coupling is optimal because the diffraction grating and the waveguide are made using the same lithography steps. The diffraction grating and the core of the waveguide are perfectly aligned. This alignment is the reflection of tolerances of mask dimensions. This alignment is better than if two masks were used, one for each portion of the guide structure. There is no need to etch the III-V or II-VI material to make the mirrors.

Figure 6:
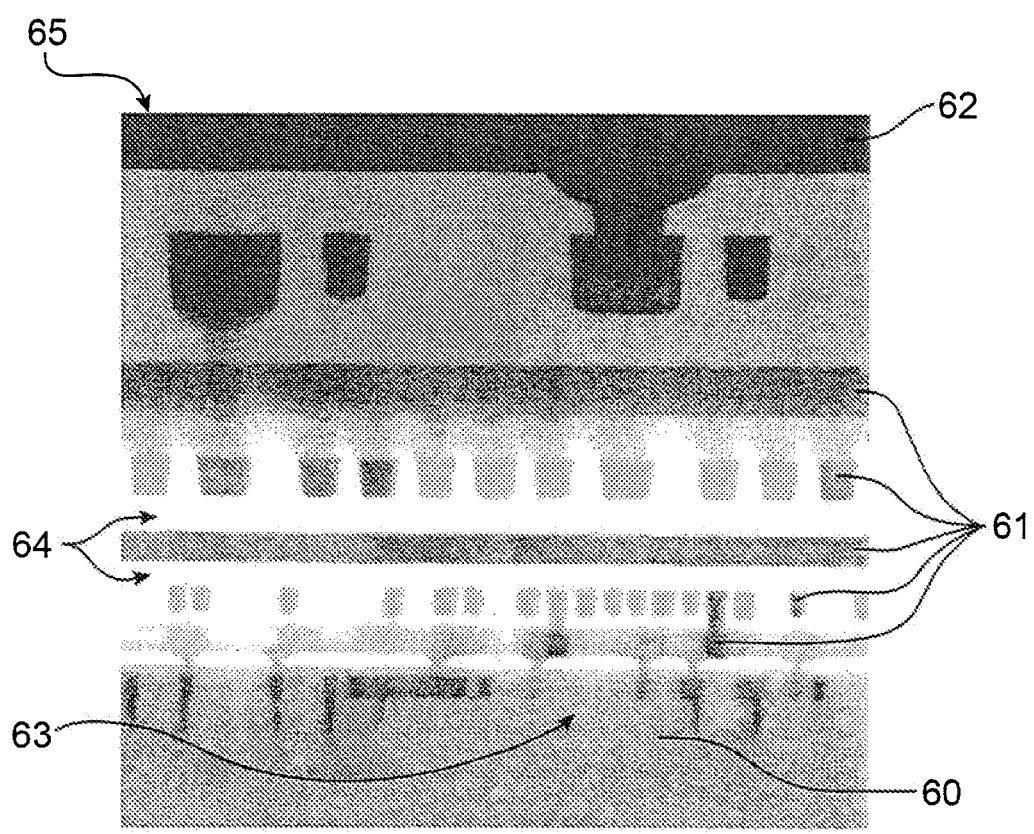
FIG. 6 shows a CMOS integrated circuit on which the locations at which the laser device according to the invention can be placed have been marked.

Instead of using an SOI substrate to make the guide structure of the laser device according to the invention, it can be placed in several levels of a CMOS circuit as shown in FIG. 6, which is a photograph of a section through a CMOS circuit taken with a scanning electron microscope. The bottom part 60 of the photograph represents the CMOS circuit. The darker parts are metallic interconnections 61 placed on several levels, each of these levels being separated by a dielectric material. Finally, at the surface there are the final metallisations 62. The laser device according to the invention, in other words the guide structure and the emitting structure, may be located at several different levels referenced by the arrows 63, 64, 65. The laser device is not shown in this figure, it simply shows where it could be.

Level reference 63 corresponds to the CMOS circuit 60, level 64 corresponds to the dielectric material between two metallisation levels 61, and level 65 is subjacent to the final metallisations 62.

It will be understood that various changes and modifications could be made without going outside the scope of the invention, particularly concerning materials used and deposition or etching techniques.

The invention claimed is:

1. A laser device comprising:
a distributed feedback laser source including a first layer comprising a light emitting structure formed of group III-V materials or group II-VI materials;
a guide structure operable to deliver light generated by the light emitting structure comprising at least a first portion and a second portion,
the first portion includes a diffraction grating that forms a reflector of the laser source and cooperates with the light emitting structure,
the second portion is a waveguide having a core surrounded by a cladding, said waveguide delivers light generated by the light emitting structure and propagated in the first portion,
wherein the guide structure comprises a second layer in silicon, third and fourth layers realized in dielectric material made from silicon alloy and surrounding said silicon second layer,
wherein said silicon second layer is structured to form the diffraction grating in the first portion and forms the core of the waveguide in the second portion, said diffraction grating and said core being aligned one to the other, and
wherein the guide structure and the light emitting structure are stacked one on the other, the third layer being located between the first layer and the second layer.

2. The laser device of claim 1, wherein the diffraction grating comprises an alternation between zones of the second layer and zones of dielectric material comprising silicon.

3. The laser device of claim 1, wherein the laser source is electrically pumped.

4. The laser device of claim 1, wherein the core of the waveguide has an approximately constant refraction index.

5. The laser device of claim 1, wherein the diffraction grating is of the distributed mirror type.

6. The laser device of claim 1, wherein the diffraction grating comprises a phase shifter.

7. The laser device of claim 1, wherein the guide structure comprises a third portion that forms an adiabatic passage between the first portion and the second portion.

8. The laser device of claim 1, wherein the guide structure also comprises two additional successive portions, on the input side of the second portion, the first of which houses a second refraction grating and the second houses an amplifying cavity, the amplifying cavity being inserted between the first diffraction grating and the second diffraction grating.

9. The laser device of claim 1, wherein the light emitting structure is a stack comprising, starting from the guide structure, a second electrical contact-making layer, a second cladding layer, a second spacer layer, an active layer, a first spacer layer, a first cladding layer, and a first electrical contact-making layer.

10. The laser device of claim 9, wherein each electrical contact-making layer cooperates with an electrical contact strip.

11. Method for making at least one laser device comprising a distributed feedback laser source, comprising a light emitting structure and a guide structure operable to deliver light generated by the light emitting structure, characterised in that it comprises the following steps:
make the light emitting structure from III-V or II-VI material;
make the guide structure with at least a first portion and a second portion,
the first portion including a diffraction grating;
the second portion being a waveguide having a core surrounded by a cladding;
the guide structure comprising a silicon layer, said silicon layer being structured to form the diffraction grating in the first portion and forming the core of the waveguide in the second portion, assemble the emitting structure and the guide structure by molecular bonding, by stacking them such that the diffraction grating forms a reflector of the laser source reflector and cooperates with the light emitting structure and the waveguide delivers light generated by the light emitting structure, and propagated in the first portion.

12. The method of claim 11, wherein the guide structure is made from an SOI substrate with two silicon layers separated by a dielectric layer, one of the silicon layers being thinner than the other, the thinnest silicon layer being structured to form the diffraction grating in the first portion and forming the core of the waveguide in the second portion.

13. The method of claim 12, wherein the diffraction grating is obtained by etching grooves in the thinnest silicon layer and filling in with dielectric material.

14. The method of claim 12, wherein the light emitting structure is subdivided into several portions by etching of the second electrical contact-making layer.

15. The method of claim 11, wherein a layer of embedding material is deposited on the silicon layer of the guide structure.

16. The method of claim 11, wherein the emitting structure is made on a substrate made of a III-V or II-VI material, by stacking a sequence of layers, starting from the substrate, to obtain a first electrical contact-making layer, a first-cladding layer, a first spacer layer, an active layer, a second spacer layer, a second cladding layer, a second electrical contact-making layer, said layers being made of III-V or II-VI materials.

17. The method of claim 16, wherein the active layer is made by stacking several sub-layers to obtain one or several quantum wells.

18. The method of claim 16, wherein a stop layer is deposited on the substrate, before the first electrical contact-making layer.

19. The method of claim 18, wherein the substrate made of III-V or II-VI material is eliminated, stopping on the stop layer after assembly.

20. The method of claim 19, wherein the stop layer is eliminated after eliminating the substrate made from III-V or II-VI material.

21. The method of claim 16, wherein a bond layer is made on the second contact electrical contact-making layer before assembly to the guide structure.

22. The method of claim 21, wherein there is a polishing step of the bond layer and the layer of embedding material to facilitate assembly.

23. The method of claim 16, wherein at least a first electrical contact strip is deposited on the first electrical contact-making layer.

24. The method of claim 16, wherein at least one zone of the second electrical contact-making layer is exposed before at least one second electrical contact strip is deposited on it.

* * * * *